United States Patent [19]

Wallace

[11] Patent Number: 4,579,626
[45] Date of Patent: Apr. 1, 1986

[54] METHOD OF MAKING A CHARGE-COUPLED DEVICE IMAGER

[75] Inventor: Lloyd F. Wallace, Coatsville, Pa.

[73] Assignee: RCA Corporation, Princeton, N.J.

[21] Appl. No.: 706,751

[22] Filed: Feb. 28, 1985

[51] Int. Cl.$^4$ .................. B44C 1/22; C03C 15/00; H01L 21/22; H01L 21/38
[52] U.S. Cl. .................. 156/651; 29/576 B; 148/1.5; 148/187; 156/653; 156/657; 156/659.1; 357/24; 357/91
[58] Field of Search .............. 156/643, 646, 651, 653, 156/657, 659.1; 148/1.5, 187, 190; 204/192 N; 29/576 B; 357/24, 91

[56] References Cited

U.S. PATENT DOCUMENTS

| | | | |
|---|---|---|---|
| 3,666,548 | 5/1972 | Brack et al. | 117/212 |
| 3,769,109 | 10/1973 | MacRae et al. | 156/3 |
| 4,104,085 | 8/1978 | Zandveid | 148/1.5 |
| 4,362,575 | 12/1982 | Wallace | 148/1.5 |

Primary Examiner—William A. Powell
Attorney, Agent, or Firm—Birgit E. Morris; Donald S. Cohen

[57] ABSTRACT

The present invention relates to a method of forming a frame transfer CCD imager having in a substrate of single crystalline silicon of one conductivity type a plurality of parallel channels of the opposite conductivity type extending along a surface of the substrate, channel stop regions between the channels, blooming drains within the channel stop regions and potential barrier region beneath each blooming drain. The method includes forming on the surface of the substrate a first masking layer of silicon oxide and a second masking layer of a photoresist over the first masking layer. Aligned openings are formed in the first and second masking layers with the openings in the first masking layer having sides which taper back under the second masking layer. Ions of a desired conductivity modifier are implanted into the substrate through the aligned openings to form the blooming drains. The second masking layer is removed and ions of a conductivity modifier are implanted through the openings in the first masking layer and through the thin portions of the tapered sides of the openings to form a region around each of the blooming drains. A portion of this region beneath the blooming drains forms the potential barrier regions and the portions at each side of the blooming drains defines the channel stop regions. The first masking layer is then removed and ions of a conductivity modifier are implanted into the entire surface of the substrate to form the channels and the channel stop regions.

6 Claims, 5 Drawing Figures

METHOD OF MAKING A CHARGE-COUPLED DEVICE IMAGER

The present invention relates to a method of making a charge-coupled device (CCD) imager having barrier regions and blooming drains between the channels of the CCD, and more particularly, to a method of making such a CCD which minimizes the number of steps required to carry out the method and makes a more compact device.

BACKGROUND OF THE INVENTION

The photosensing area of a frame transfer CCD imager includes a plurality of parallel channels in and extending along the surface of a substrate of semi-conductor material. The channels are generally of N type conductivity in the substrate of P type conductivity. Between the channels are channel stop regions which are of N− type conductivity and which extend along the surface of the substrate. Within the channel stop regions are blooming drain regions of N+ type conductivity. L. F. Wallace in U.S. Pat. No. 4,362,575, issued Dec. 7, 1982, entitled "Method of Making Buried Channel Charge Coupled Device With Means For Controlling Excess Charge", describes a method of making such a CCD imager with the blooming drains being self-aligned with the channel stop regions. The Wallace method includes forming a silicon oxide masking layer on the surface of the substrate and coating the masking layer with a layer of a photoresist material. Using standard photolithographic techniques, openings are formed in the resist layer where the blooming drains are to be formed, and the areas of the masking layer exposed by the openings in the resist layer are removed with a suitable etchant to form openings to the surface of the substrate. N type conductivity modifiers, such as arsenic or phosphorus, are then implanted into the exposed areas of the substrate to form the blooming drains. The openings in the masking layer are then made larger by etching away the masking layer under the resist layer to expose areas of the substrate surface on each side of the blooming drains. The resist layer is then removed and P type conductivity modifiers, such as boron, are implanted into the exposed surface areas of the substrate to form a highly doped P type region around each blooming drain. The masking layer is then removed and N type conductivity modifiers are embedded into the entire area of the substrate surface. This forms the N type channels between the blooming drains and compensates the P type region on each side of the blooming drains to form N− type channel stop regions between each channel and each blooming drain.

E. D. Savoye et al. in patent application Ser. No. 455,332, entitled "Imaging Array Having Higher Sensitivity and a Method of Making Same" filed Jan. 3, 1983 and assigned to the same assignee as the present application, discloses a frame transfer CCD imager including a highly conductive P type potential barrier region beneath each blooming drain region to direct charge carriers generated in the substrate towards the channels. Savoye et al. make the CCD by the same method as described by Wallace with one additional step, i.e., the blooming drains are formed but before enlarging the openings in the masking layer, P type conductivity modifiers, such as boron, are implanted into the substrate through the blooming drains to form the potential barrier regions under the blooming drains.

The method disclosed by Wallace and Savoye et al. are suitable for forming the CCD imagers having self-aligned blooming drains in the channel stop regions. However, it would be desirable to reduce the number of steps necessary to form such devices. Also, the etch back of the masking layer to define the channel stop regions forms relatively wide channel stop regions. It has been found that the relatively wide channel stop regions are not only essential for the operation of the device, but they also take up additional space which enlarges the entire CCD imager.

SUMMARY OF THE INVENTION

A method of making a charge-coupled device includes forming a first masking layer on a surface of a substrate of single crystalline silicon of one conductivity type. The first masking layer is coated with a second masking layer and openings are formed in the second masking layer over the areas of the substrate surface where blooming drains are to be formed. The areas of the first masking layer exposed by the openings in the second masking layer are then removed to form openings in the first masking layer to the substrate surface. A conductivity modifier of the type opposite to that of the substrate is then embedded into the substrate through the openings in the masking layers to form the blooming drains. The second masking layer is then removed and a conductivity modifier of the same type as the substrate is then embedded into the substrate through the openings in the first masking layer and through portions of the first masking layer adjacent the edges of the openings to form regions of the one conductivity type in the substrate around each of the blooming drains. The first masking layer is then removed and a conductivity modifier of the type opposite to that of the substrate is embedded into the substrate surface to form channels between the blooming drains and to compensate the portions of the one conductivity regions on each side of the blooming drains to form channel stop regions.

DETAILED DESCRIPTION OF PREFERRED EMBODIMENT

Figure 1:
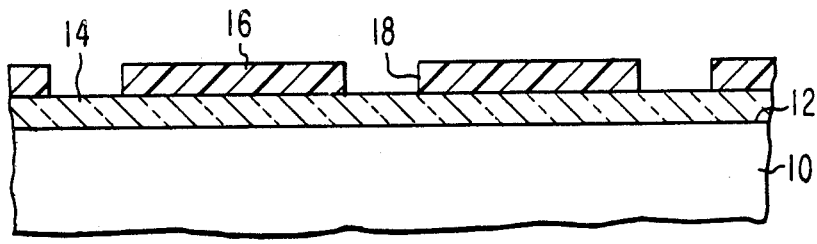
FIGS. 1-5 are sectional views through a portion of a CCD imager illustrating the various steps of the method of the present invention.

To carry out the method of the present invention a substrate 10 of single crystalline silicon of one conductivity type, preferably P type, is provided on one of its major surfaces 12 with a first masking layer 14, preferably of silicon oxide. A silicon oxide masking layer 14 may be formed on the surface 12 such as by thermally growing it in an ambient of steam and hydrogen chloride at a temperature of about 900° C. The first masking layer 14 is coated with a second masking layer 16 of a photoresist material. Using standard photolithographic techniques, the resist masking layer 16 is provided with openings 18 therethrough over the areas of the substrate 14 where blooming drains are to be formed, as shown in FIG. 1.

Figure 2:
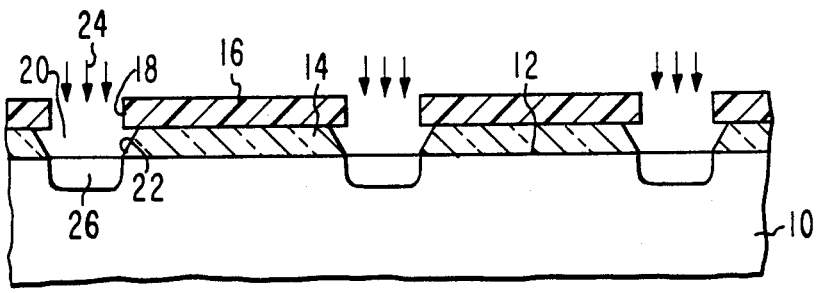

As shown in FIG. 2, the areas of the first masking layer 14 exposed by the openings 18 in the second masking layer 16 are then removed with a suitable etchant, such as buffered hydrofluoric acid, to form the openings 20 through the first masking layer 14 to the substrate surface 12. In forming the openings 20 in the first masking layer 14, the sidewalls 22 of the openings 20 will be etched back slightly under the second masking layer 16 so that the sidewalls 22 are tapered in a direction away from the opening 18 from the substrate surface 12 to the second masking layer 16. Thus, at each of the openings 20, the first masking layer 14 is thin adjacent the edge of the opening 18 and increases in thickness away from the edge of the opening 18.

As indicated by the arrows 24, ions of an N type conductivity modifier are then embedded into the substrate 10 through the openings 18 and 20 in the masking layers 16 and 14 respectively to form the blooming drains 26. The N type conductivity modifier is preferably arsenic, although phosphorus can be used. The ions are embedded in the substrate 10 preferably by ion implantation with the masking layers 14 and 16 serving to confine the ions which reach the substrate 10 to the areas directly exposed by the openings 18 and 20.

Figure 3:
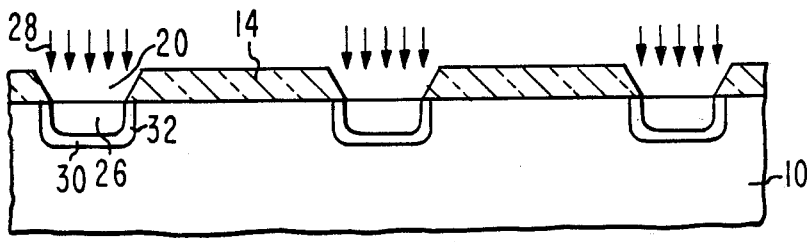
Figure 4:
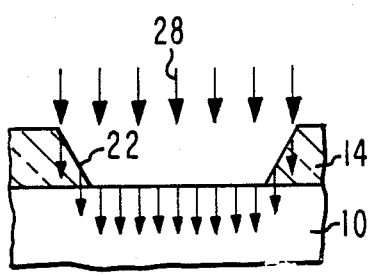

As shown in FIG. 3, the resist second masking layer 16 is then removed with a suitable solvent. As indicated by the arrows 28, ions of a P type conductivity modifier, such as boron, are then embedded into the substrate 10 through the openings 20 in the masking layer 14. A heavy dosage of the boron ions are implanted into the substrate 10 so that the boron ions pass through the blooming drains 26 to form P+ regions 30 under the blooming drains 26. As shown in FIG. 4, the boron atoms will not only enter the exposed areas of the substrate 10, but will also pass through the thinner edge portions of the masking layer 14 so that the boron atoms also enter the substrate 10 at each side of the blooming drains 26. However, as the masking layer 14 becomes thicker it will stop the boron atoms from passing through the masking layer 14. Therefore, as shown in FIG. 3, a narrow P+ region 32 will be formed in the substrate 10 at each side of the blooming drain 26. The P+ regions 30 formed under each blooming drain 26 provides the potential barrier region described by Savoye et al. The P+ region 32 at each side of the blooming drain 26 defines the width of the channel stop regions.

Figure 5:
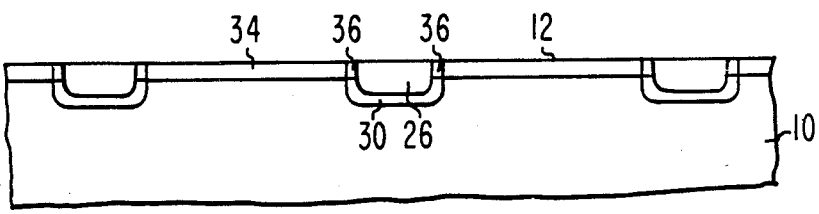

The silicon oxide masking layer 14 is then removed with a suitable etchant. As described by Wallace and Savoye et al., ions of an N type conductivity modifier, such as phosphorus are then embedded into the entire surface 12 of the substrate 10. As shown in FIG. 5, this forms the channels 34 between the blooming drains 26. This also counterdopes the surface portions of the P+ doped regions 32 to form the N− type channel stops 36 between each of the blooming drains 26 and the adjacent channels 34. As described by Wallace and Savoye et al., the CCD imager can be completed by forming a channel oxide layer on the surface 12 of the substrate and conductive gates on the channel oxide layer.

The method of the present invention has the advantage that it eliminates two steps of the method previously used and described by Savoye et al. The method of the present invention eliminates the need to etch back the openings in the first oxide masking layer to define the channel stop regions and instead uses the tapered sides 22 of the openings 20 in the first masking layer 14 to define the channel stop regions. In addition, the method of the present invention uses only a single implantation step to form the P+ regions completely around the blooming drains 26 rather than two separate implantation steps. Thus, the method of the present invention is easier to carry out. In addition, the etching of the openings in the first masking layer to define the width of the channel stop regions disclosed by Wallace and Savoye et al. provided relatively wide channel stop regions. The method of the present invention defines narrow channel stop regions which have been found to be satisfactory for their intended purpose. The narrow channel stop regions also allows the formation of a more dense device so that the entire device can be made smaller.

I claim:

1. A method of making a charge-coupled device comprising forming a first masking layer on a surface of a substrate of single crystalline silicon of one conductivity type, coating the first masking layer with a second masking layer, forming openings in the second masking layer over areas of the substrate surface where blooming drains are to be formed, removing the areas of the first masking layer exposed by the openings in the second masking layer to form openings in the first masking layer to the substrate surface, embedding a conductivity modifier of the type opposite to that of the substrate into the substrate through the openings in the first and second masking layers to form blooming drains in the substrate, removing the second masking layer, embedding a conductivity modifier of the same type as the substrate through the openings in the first masking layer and through portions of the first masking layer adjacent the edges of the openings to form regions of the one conductivity type in the substrate around each of the blooming drains, removing the first masking layer, and embedding a conductivity modifier of the type opposite to that of the substrate into the substrate surface to form channels between the blooming drain and to compensate the portion of the one conductivity type regions at each side of the blooming drains to form channel stop regions.

2. A method in accordance with claim 1 in which the areas of the first masking layer are removed so as to provide openings having side walls which taper back from the substrate surface under the second masking layer so that the first masking layer has thinner portions adjacent the exposed surface of the substrate.

3. A method in accordance with claim 2 in which the first masking layer is of silicon oxide and the areas of the first masking layer are removed by etching.

4. A method in accordance with claim 3 in which the second masking layer is a photoresist material and the openings are photolithographically formed in the second masking layer.

5. A method in accordance with claim 2 in which the conductivity modifiers of the same type as the substrate are embedded into the substrate through the openings in the first masking layer by ion implantation with some of the ions passing through the thinner portions of the first masking layer to form the poritons of the one conductivity type at each side of the blooming drains.

6. A method in accordance with claim 5 in which the ions are implanted into the substrate in a manner to pass through the blooming drains to form portions of the regions of the one conductivity type under the blooming drains.

* * * * *